United States Patent

Väisänen

Patent Number: 5,379,458
Date of Patent: Jan. 3, 1995

[54] TRANSFORMERLESS DIODE MIXER

[75] Inventor: Risto Väisänen, Salo, Finland

[73] Assignee: Nokia Mobile Phones Ltd., Salo, Finland

[21] Appl. No.: 989,076

[22] Filed: Dec. 11, 1992

[30] Foreign Application Priority Data

Dec. 19, 1991 [FI] Finland ............... 91 6006

[51] Int. Cl.[6] ............... H04B 1/26; H03B 19/18; H03B 19/20
[52] U.S. Cl. ............... 455/330; 455/319; 327/113
[58] Field of Search ............... 455/323, 325, 327, 330, 455/318, 319, 333; 307/529, 282; 328/104; 333/100, 101, 117, 118, 129, 131, 24 R, 25, 181

[56] References Cited

U.S. PATENT DOCUMENTS

| 4,371,982 | 2/1983 | Hallford | 455/330 |
| 4,592,095 | 5/1986 | Ohnishi et al. | 455/333 |
| 4,864,644 | 9/1989 | Takahashi et al. | 455/326 |
| 5,003,622 | 3/1991 | Ma et al. | 455/330 |
| 5,054,118 | 10/1991 | Holcomb et al. | 455/326 |
| 5,175,885 | 12/1992 | Lange et al. | 455/330 |
| 5,212,835 | 5/1993 | Suzuki | 455/330 |
| 5,263,198 | 11/1993 | Geddes et al. | 455/325 |

*Primary Examiner*—Edward F. Urban
*Assistant Examiner*—Mark D. Wisler
*Attorney, Agent, or Firm*—Perman & Green

[57] ABSTRACT

In the simplified diode mixer according to the invention the transformer supplying the local oscillator signal is replaced by a circuit means that prevents build-up of a d.c. voltage at the terminals of the mixer diodes (3, 4). The circuit means can be e.g. a coil (5), a strip line, or a diode pair. The filters (1, 2) for the signals to be mixed are realized as band-pass filters. The mixer is used e.g. in a GSM mobile phone.

9 Claims, 2 Drawing Sheets

TRANSFORMERLESS DIODE MIXER

This invention relates to a diode mixer, particularly a radio frequency diode mixer used in radio telephones, wherein the mixer has a mixing point to which an r.f. signal is connected via a filter, an oscillator signal is applied to serially connected diodes, and the mixing point is between the diodes and provides an output signal.

Diode mixers are well known in the art. FIG. 1 schematically shows a typical embodiment of a diode mixer 100, in which the mixer comprises an r.f. transformer 105, two diodes 103 and 104, a high-pass filter 101 and a low-pass filter 102. A diode mixer of this type is particularly well suitable for cases where the frequency RF to be mixed and the mixing result IF are not close to each other, whereby the signals can be separated with filters. The local oscillator signal LO is isolated with the transformer. The r.f. transformer functions to generate equally high signals of opposite phase for the diodes 103, 104, whereby the local oscillator signal is considerably attenuated in the common mixing point of the diodes. The attenuation is necessary, because otherwise the local oscillator signal would pass through the low-pass or high-pass filters to other stages connected to the mixer. The transformer also functions to prevent d.c. voltage build-up at the diode terminals. Such an effect occurs as a result of the rectification in the diodes and due to the diode capacitances.

In the development of radiotelephones it is vigorously sought to reduce the size of the structures. In presently known mixers the transformer takes the largest part of the space required by the mixer and also constitutes the greatest part of the mixer total price. Thus the object of the invention is to find a simpler circuit design, without impairing the electrical characteristics of the mixer.

This objective is achieved with the characteristics of claim 1. According to the invention a circuit means is connected in parallel with the mixer diodes, the circuit means conducting a current in the local oscillator circuit so that no d.c. potential is formed in the mixing point between the diodes. The circuit means can be realized either with a coil or with diodes. Then the filters preferably are band-pass filters.

Below the invention is described in more detail with reference to the enclosed drawing, in which.

Figure 1:
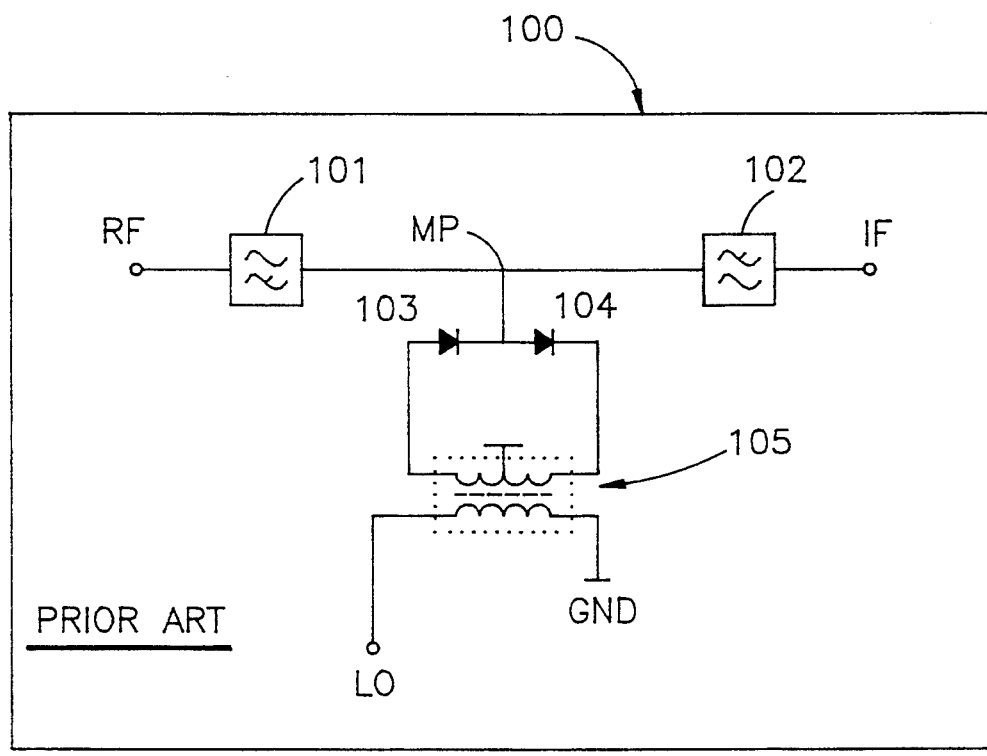
FIG. 1 shows a prior art diode mixer realized with a transformer.
Figure 2:
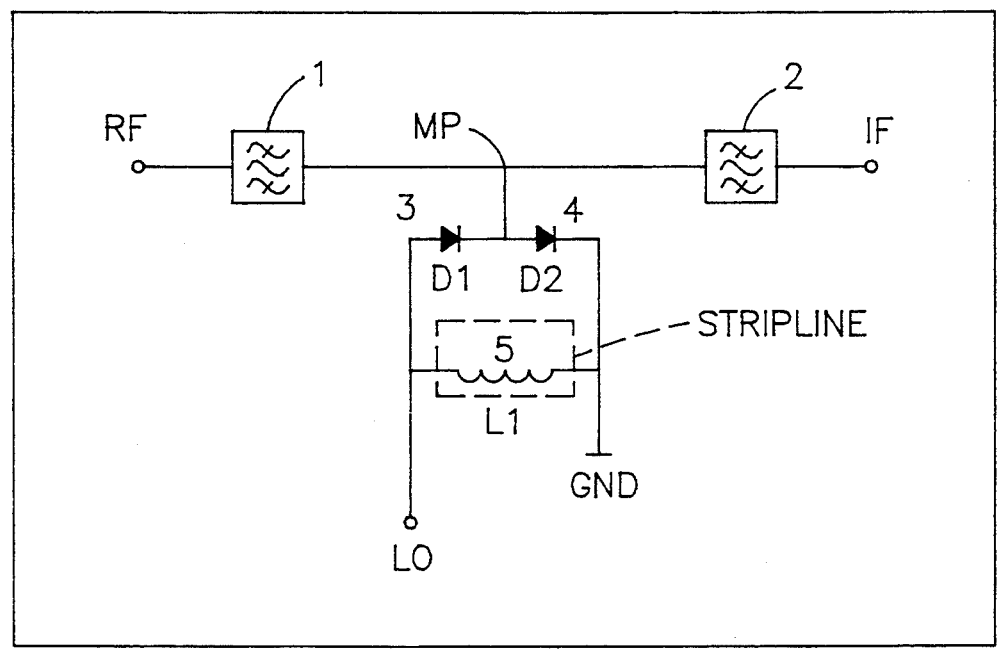
FIG. 2 shows an embodiment of a simplified diode mixer according to the invention using a coil.

FIG. 2 shows the basic diagram of the diode mixer according to the invention. The r.f. transformer 105 of FIG. 1 is replaced by a coil 5, and the low-pass and high-pass filters 101 and 102, respectively, are replaced by band-pass filters 1 and 2. The local oscillator signal LO is supplied directly to the diodes 3 and 4 (D1, D2) by coupling the signal to the anode of diode 3. Because the diodes are in series, they are conducting and non-conducting at the same time, in the same way as in the known circuit of FIG. 1 realized with a transformer. Build-up of a d.c. voltage at the diode terminals is prevented by coupling the coil 5 (L1) from the anode of diode 3 to the cathode of diode 4, or in parallel with the diodes. The attenuation of the local oscillator signal LO to the i.f. output IF and to the r.f. input RF is accomplished by replacing the high-pass and low-pass filters 101, 102 of FIG. 1 by band-pass filters 1 and 2, respectively.

At high frequencies the coil L1 could be realized as a strip line.

The band-pass filters 1 and 2 can be realized in any filter technique, but a simple series resonant circuit formed by a coil and a capacitor is preferable.

Figure 3:
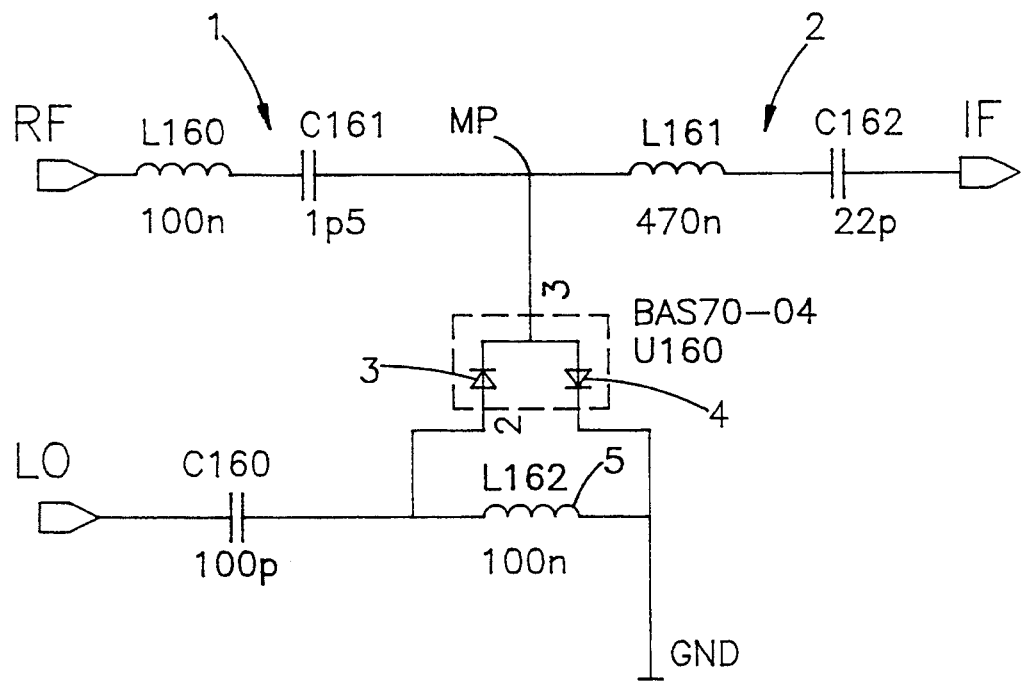
FIG. 3 shows the detailed circuit diagram of the diode mixer according to FIG. 2.

FIG. 3 shows a mixer realized in practice. The r.f. input signal RF is supplied to the mixing point MP between the mixer diodes 3 and 4 through the series resonant circuit formed by the coil L160 and the capacitor C161. The intermediate frequency IF is correspondingly obtained at the mixing point of the diodes 3, 4 via the series resonant circuit formed by the coil L161 and the capacitor C162. The diodes 3, 4 are realized in one component U160. The local oscillator signal is supplied substantially directly to the anode of the diode 3 through the capacitor C160, which isolates the d.c. circuits from each other. This design functions well when the frequencies to be mixed are far from each other. On the other hand, if the frequencies to be mixed are close to each other it is necessary to use a dual-balanced mixer comprising e.g two transformers and four diodes. In most practical applications the frequencies to be mixed, RF, IF and the local oscillator frequency LO, are far from each other, whereby the very simple mixer of FIG. 3 functions as well as a mixer realized with a transformer. In the solutions shown in FIG. 2 and 3 the function of the circuit means, i.e. the coil, the inductor, or the strip line, is generally to keep the biasing of the diodes at zero, in other words to prevent a d.c. voltage to be formed due to the local oscillator signal and an asymmetric load impedance and the diode capacitances.

The coil, the inductor, or the strip line could thus represent e.g. an infinite impedance at the local oscillator frequency, and thus it will not take an active part in conducting the signal to ground.

If the circuit means comprises two diodes the mixer's local oscillator port impedance is symmetric on both half-cycles, whereby no d.c. voltage is formed at the mixer diode terminals, and thus the diodes will not drift into a constantly conducting state.

The component values shown in FIG. 3 are exemplary values used for a certain application. With the guidelines presented here a person skilled in the art can naturally change the component values to suit the actual application, utilizing design methods known per se.

For the sake of clarity it should be noted that the presented diode mixer according to the invention provides a smaller size than the prior art solution (FIG. 1). Correspondingly the invention lowers the costs. Further the requirements on filtering out-band signals from the i.f. signal are reduced, because a band-pass filter is used in front of the diodes, i.e. at the r.f. input.

Figure 4:
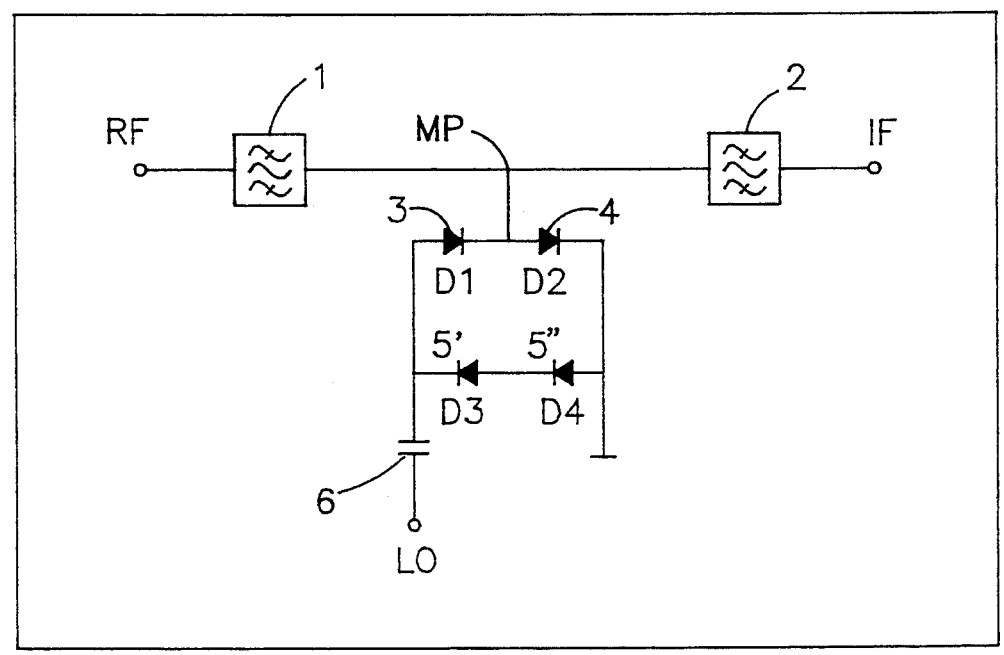
FIG. 4 shows a second embodiment of a simplified diode mixer according to the invention using four diodes in all.

FIG. 4 shows as a circuit the principle of a second embodiment of the invention, where the coil 2 is replaced by two diodes 5' and 5''. During the second half-cycle of the local oscillator signal LO the diodes 3 and 4 conduct the signal to the mixing point MP and further to the signal ground GND; correspondingly, during the second half-cycle the diodes 5' and 5'' conduct the signal in the opposite direction. This prevents rectification of the r.f. signal and build-up of a d.c. voltage at the diode terminals.

The diode solution according to FIG. 4 is attractive because it is easy to realize as an integrated circuit. At present this preferred solution has a slight disadvantage in that half of the local oscillator signal in a sense is lost in the diodes 5′ and 5″ (D3 and D4).

The diodes 3 and 4 (D1, D2) shown in FIGS. 2, 3 and 4 also be connected in the opposite direction, i.e. so that they conduct the signal from the signal ground GND to the local oscillator input LO. Then of course also the diodes 5′ and 5″ (D3, D4) in FIG. 4 are connected in the opposite direction.

A person skilled in the art can modify the presented examples in numerous ways, e.g. the filters, as was mentioned above. Further it is conceivable to realize the circuit means 5 by other components than those presented here in the examples. It is essential that the local oscillator signal is connected substantially directly to the mixer diodes, without an intermediary transformer.

I claim:

1. A transformerless diode mixer comprising:
    a series circuit of two diodes connected in series between a first terminal and a second terminal of said series circuit, wherein a cathode of a first of said diodes is connected via a junction to an anode of a second of said diodes, said junction serving as a mixing point of said mixer;
    first filter means for capacitively coupling an r.f. signal between a first external point and said junction, said r.f. signal being an input signal to said mixer;
    second filter means for capacitively coupling an i.f. signal between said junction and a second external point, said i.f. signal being an output signal of said mixer;
    transformerless signal means for applying an oscillatory signal to said series circuit, said signal means being connected between said first and said second terminals of said series circuit;
    wherein said tranformerless signal means includes potential means in parallel with said series circuit for maintaining a nearly zero d.c. voltage across said series circuit by inhibiting rectification of the r.f. signal and build-up of a d.c. voltage at terminals of said diodes.

2. A mixer according to claim 1 wherein said potential means is separate from said signal means.

3. A mixer according to claim 2 wherein said potential means comprises a coil.

4. A mixer according to claim 3 wherein said coil is fabricated as stripline.

5. A mixer according to claim 2 wherein said potential means comprises a third diode and a fourth diode serially connected to each other to conduct current in a common direction, the direction of conduction of the diodes of said potential means being opposite to a direction of conduction of said series circuit of said first and said second diodes.

6. A mixer according to claim 5 wherein one of said first and said second terminals of said series circuit is connected to ground, and wherein said signal means applies current via said series circuit to ground during one half cycle of the oscillatory signal, and applies current via said potential means to ground during a second half cycle of the oscillatory signal.

7. A mixer according to claim 1 wherein each of said first and said second filter means comprises a band pass filter.

8. A mixer according to claim 7 wherein each of said first and said second filter means comprises a series resonant circuit of a coil and a capacitor.

9. A mixer according to claim 1 wherein said first filter means has a pass band located in the r.f. spectral region of a radiotelephone, including a GSM-telephone.

* * * * *